United States Patent
White et al.

(10) Patent No.: US 8,541,310 B2
(45) Date of Patent: Sep. 24, 2013

(54) CMP COMPOSITIONS CONTAINING A SOLUBLE PEROXOMETALATE COMPLEX AND METHODS OF USE THEREOF

(75) Inventors: Daniela White, Oswego, IL (US); John Parker, Naperville, IL (US)

(73) Assignee: Cabot Microelectronics Corporation, Aurora, IL (US)

(*) Notice: Subject to any disclaimer, the term of this patent is extended or adjusted under 35 U.S.C. 154(b) by 762 days.

(21) Appl. No.: 11/800,188

(22) Filed: May 4, 2007

(65) Prior Publication Data

US 2008/0274619 A1     Nov. 6, 2008

(51) Int. Cl.
*H01L 21/32* (2006.01)
*H01L 21/461* (2006.01)
*B44C 1/22* (2006.01)
*C23F 1/00* (2006.01)
*C23F 15/00* (2006.01)

(52) U.S. Cl.
USPC .............. 438/693; 438/692; 216/38; 216/52; 216/53; 216/89

(58) Field of Classification Search
None
See application file for complete search history.

(56) References Cited

U.S. PATENT DOCUMENTS

| | | | |
|---|---|---|---|
| 6,740,590 B1* | 5/2004 | Yano et al. | 438/692 |
| 2001/0006224 A1* | 7/2001 | Tsuchiya et al. | 252/79 |
| 2005/0076580 A1 | 4/2005 | Tamboli et al. | |
| 2005/0211953 A1* | 9/2005 | Jha et al. | 252/79.1 |

* cited by examiner

*Primary Examiner* — Nadine G Norton
*Assistant Examiner* — Stephanie Duclair
(74) *Attorney, Agent, or Firm* — Thomas E Omholt; Robert J Ross; Steven D Weseman

(57) ABSTRACT

The present invention provides a chemical-mechanical polishing (CMP) composition for polishing a ruthenium-containing substrate in the presence of hydrogen peroxide without forming a toxic level of ruthenium tetroxide during the polishing process. The composition comprises (a) a catalytic oxidant comprising a water-soluble peroxometalate complex, an oxidizable precursor of a peroxometalate complex, or a combination thereof, (b) a particulate abrasive; and (c) an aqueous carrier. The peroxometalate complex and the precursor thereof each have a reduced form that is oxidizable by hydrogen peroxide to regenerate the peroxometalate complex during chemical-mechanical polishing. CMP methods for polishing ruthenium-containing surfaces with the CMP composition are also provided.

11 Claims, 3 Drawing Sheets

L = Lactic acid

Titanium hydroperoxosilicates

Isoperoxotungstates

CMP COMPOSITIONS CONTAINING A SOLUBLE PEROXOMETALATE COMPLEX AND METHODS OF USE THEREOF

FIELD OF THE INVENTION

This invention relates to polishing compositions and methods for polishing a substrate using the same. More particularly, this invention relates to chemical-mechanical polishing (CMP) compositions containing a soluble peroxometalate complex or an oxidizable precursor thereof as a catalytic oxidant and CMP methods for polishing ruthenium-containing substrates therewith.

BACKGROUND OF THE INVENTION

Many compositions and methods for chemical-mechanical polishing (CMP) the surface of a substrate are known in the art. Polishing compositions (also known as polishing slurries, CMP slurries, and CMP compositions) typically contain an abrasive material in an aqueous carrier. A surface of a substrate is abraded to polish the surface by contacting the surface with a polishing pad and moving a polishing pad relative to the surface while maintaining a CMP slurry between the pad and the surface. Typical abrasive materials include silicon dioxide, cerium oxide, aluminum oxide, zirconium oxide, and tin oxide. U.S. Pat. No. 5,527,423 to Neville, et al., for example, describes a method for chemically-mechanically polishing a metal layer by contacting the surface with a polishing slurry comprising high purity fine metal oxide particles in an aqueous medium. Alternatively, the abrasive material may be incorporated into the polishing pad. U.S. Pat. No. 5,489,233 to Cook et al. discloses the use of polishing pads having a surface texture or pattern, and U.S. Pat. No. 5,958,794 to Bruxvoort et al. discloses a fixed abrasive polishing pad.

Conventional polishing systems and polishing methods typically are not entirely satisfactory at planarizing metal-containing semiconductor wafers. In particular, polishing compositions and polishing pads can have less than desirable polishing rates, and their use in the chemical-mechanical polishing of semiconductor surfaces can result in poor surface quality. This is particularly true for noble metals such as ruthenium.

The difficulty in creating an effective polishing system for semiconductor wafers stems from the complexity of the semiconductor wafer. Semiconductor wafers are typically composed of a substrate on which a plurality of transistors has been formed. Integrated circuits are chemically and physically connected into a substrate by patterning regions in the substrate and layers on the substrate. To produce an operable semiconductor wafer and to maximize the yield, performance, and reliability of the wafer, it is desirable to polish select surfaces of the wafer (e.g., a metal-containing surface) without adversely affecting underlying structures or topography. In fact, various problems in semiconductor fabrication can occur if the process steps are not performed on wafer surfaces that are adequately planarized. Because the performance of a semiconductor wafer is directly associated with the planarity of its surface, it is crucial to use a polishing composition and method that results in a high polishing efficiency, uniformity, and removal rate and leaves a high quality polish with minimal surface defects. In many cases, the hardness and chemical stability of the various materials making up the wafer can vary widely, further complicating the polishing process.

In conventional CMP techniques, a substrate carrier or polishing head is mounted on a carrier assembly and positioned in contact with a polishing pad in a CMP apparatus. The carrier assembly provides a controllable pressure to the substrate, urging the substrate against the polishing pad. The substrate is moved relative to the pad by an external driving force. The relative movement of the pad and substrate serves to abrade the surface of the substrate to remove a portion of the material from the substrate surface, thereby polishing the substrate. The polishing of the substrate by the relative movement of the pad and the substrate typically is further aided by the chemical activity of the polishing composition and/or the mechanical activity of an abrasive suspended in the polishing composition.

Ruthenium is a noble metal used in fabricating high performance semiconductor devices and capacitors in DRAM devices. Because of the chemical and mechanical stability of ruthenium, substrates containing this metal generally are difficult to polish, and may require the use of strong oxidizers to achieve relatively high removal rates (e.g., 200 Å/min or greater Ru removal). Unfortunately, the use of strong oxidizers (e.g., oxone or ceric ammonium nitrate) can lead to the formation of highly toxic and volatile ruthenium(VIII) tetroxide ($RuO_4$) during the polishing process. Typically, weaker oxidants such as hydrogen peroxide are not very efficient in ruthenium polishing processes, requiring long polishing times and a high polishing pressure in order to adequately planarize the ruthenium. These conditions can result in undesirable separation of the ruthenium layer from the interlayer insulating layer, as well as dishing and erosion effects on the ruthenium layer adjacent to the interlayer. It is also desirable for Ru CMP compositions to provide relatively high silicon dioxide removal rates (e.g., about 200 Å/min or greater removal rate for plasma enhanced tetraethylorthosilicate-derived $SiO_2$, PETEOS), in addition to relatively high Ru removal rates and low defectivity.

There is an ongoing need to develop CMP compositions that are capable of polishing a semiconductor substrate, particularly a ruthenium-containing substrate, without the use of strong, $RuO_4$-generating oxidants, and which exhibit relatively high ruthenium removal rates. The present invention provides such CMP compositions. These and other advantages of the invention, as well as additional inventive features, will be apparent from the description of the invention provided herein.

BRIEF SUMMARY OF THE INVENTION

The present invention provides a CMP composition useful for polishing a ruthenium-containing substrate in the presence of hydrogen peroxide without generating a toxic level of ruthenium tetroxide. The composition comprises (a) a catalytic oxidant comprising a water-soluble peroxometalate complex and/or an oxidizable precursor thereof, which is capable of catalytically oxidizing metallic ruthenium in the presence of hydrogen peroxide, (b) a particulate abrasive, and (c) an aqueous carrier. Preferably, the composition comprises about 0.5 to about 10 percent by weight of the particulate abrasive, and about 0.05 to about 1 percent by weight of the catalytic oxidant. In use, the composition preferably is combined with hydrogen peroxide in an amount in the range of about 1 to about 5 percent by weight, based on the combined weight of the composition and hydrogen peroxide.

The catalytic oxidant comprises a water-soluble peroxometalate complex. Any water-soluble peroxometalate capable of catalytically oxidizing metallic ruthenium and/or any suitable oxidizable precursor thereof, can be utilized in the compositions of the present invention, so long as the reduced form of the peroxometalate or precursor is oxidizable by hydrogen peroxide to form and/or regenerate the peroxometalate complex. Non-limiting examples of suitable peroxometalate complexes include peroxotitanium compounds, isoperoxotungstate compounds, titanium hydroperoxosilicate compounds, and the like. Preferably, the precursor of the peroxometalate complex comprises an acidic tungsten-containing compound (e.g., tungstic acid, polytungstic acid, phosphotungstic acid, and a combination of two or more thereof) and/or a titanate compound (e.g., a titanium(IV) citrate complex, a titanium(IV) lactate complex, and a combination thereof). Non-limiting examples of suitable oxidizable precursors of peroxometalate complexes include tungstic acid, phosphotungstic acid, titanium(IV) salts such as titanium (IV) bis(ammonium lactate) dihydroxide, ammonium citratoperoxotitanate (IV), Keggin anions of tungsten, phosphorus, and/or molybdenum, and the like.

The compositions of the present invention desirably provide relatively high ruthenium removal rates of about 200 Å/min or greater when utilized in typical CMP processes. Advantageously, the CMP compositions of the invention provide $SiO_2$ (PETEOS) removal rates in the range of about 200 Å/min or greater, as well.

In another aspect, the present invention provides a CMP method for polishing a ruthenium-containing substrate. The method comprises the steps of contacting a surface of the substrate (e.g., a ruthenium-containing substrate) with a polishing pad and an aqueous CMP composition of the present invention, in the presence of hydrogen peroxide, and causing relative motion between the substrate and the polishing pad while maintaining at least a portion of the CMP composition and hydrogen peroxide in contact with the surface between the pad and the substrate for a time period sufficient to abrade at least a portion of the ruthenium from the surface.

The CMP compositions of the invention are effective for polishing substrates including a metal such as ruthenium, while simultaneously maintaining suitable $SiO_2$ removal rates, without forming toxic levels of $RuO_4$ during the polishing process.

DETAILED DESCRIPTION OF THE INVENTION

Figure 1:
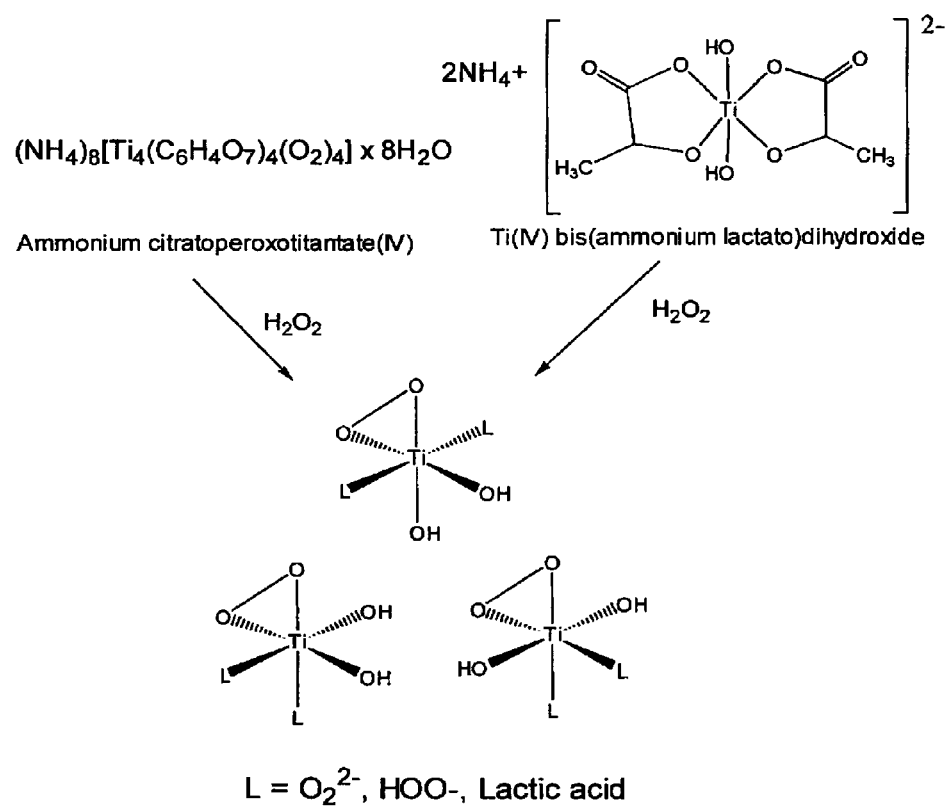
FIG. 1 illustrates typical syntheses of peroxotitanium complexes.

The present invention provides a CMP composition suitable for use in CMP of ruthenium-containing substrates in combination with hydrogen peroxide without forming a toxic level of ruthenium tetroxide. The composition includes an aqueous carrier containing a particulate abrasive and a catalytic oxidant comprising a water-soluble peroxometalate complex and/or an oxidizable precursor thereof capable of generating the catalytic peroxometalate oxidant in the presence of hydrogen peroxide. The composition is utilized in a CMP process in combination with hydrogen peroxide (e.g., by adding hydrogen peroxide to the composition prior to or during CMP) to polish a ruthenium-containing substrate. The catalytic oxidant oxidizes ruthenium, allowing the ruthenium to be readily abraded from the surface as $RuO_2$. The oxidative strength of the catalytic oxidant is such that it does not form undesirable higher oxidation state ruthenium species (e.g., RuVIII) during the CMP process, thus avoiding the formation of toxic ruthenium tetroxide. Upon oxidizing the ruthenium, the catalytic oxidant is converted to a reduced form (i.e., a precursor form), which is then reoxidized by the hydrogen peroxide to regenerate the peroxometalate oxidant. In one embodiment of the present invention, the composition can include about 1 to about 5 percent by weight of hydrogen peroxide (i.e., prior to use). Alternatively, and preferably, the hydrogen peroxide is added to the composition just prior to the start of CMP and/or during the CMP process.

The peroxometalate complex can be an isoperoxometalate or a heteroperoxometalate (i.e., oxides of a single metallic element or a oxides of a plurality of different elements, respectively). Suitable isoperoxometalates can be prepared by oxidizing (e.g., with hydrogen peroxide) suitable precursor compounds, such as tungstic acid or polytungstic acid to form an isoperoxotungstate compound (e.g., a $H_2W_{12}O_{42}^{-10}$ salt, a $W_{12}O_{39}^{-6}$ salt, a $W_{10}O_{32}^{-4}$ salt, and the like), a molybdic acid to form an isoperoxomolybdate compound (e.g., a $Mo_7O_{24}^{-6}$ salt, a $Mo_8O_{26}^{-4}$ salt, a $H_2Mo_{12}O_{40}^{-6}$ salt, and the like), or a titanate compound to form a peroxotitanate compound, and the like. Similarly, non-limiting examples of suitable heteroperoxometalate compounds can be formed by oxidation of Keggin anion compounds, which have the general formula $X^{+n}M_{12}O_{40}^{-(8-n)}$, wherein "M" typically is Mo or W, and "X" typically is a polyvalent atom such as $Cu^{II}$, $Zn^{II}$, $Ni^{II}$, $Co^{II}$, , $Co^{III}$, $Fe^{III}$, $B^{III}$, $Ga^{III}$, $Al^{III}$, $Cr^{III}$, $Mn^{IV}$, Ni $Mn^{IV}$, Ti $Mn^{IV}$, Zr $Mn^{IV}$, Si $Mn^{IV}$, Ge $Mn^{IV}$, P $Mn^{V}$, $As^{V}$, $Te^{VI}$, $I^{VII}$ and the like, (e.g., a salt of $SiW_{12}O_{40}^{-4}$ and the like), as well as other heteropolymetalate compounds, such as those having the formulas: $X^{+n}M_{12}O_{42}^{-(12-n)}$, $X^{+n}M_{12}O_{40}^{-(8-n)}$, $(X^{+n})_2 M_{18}O_{62}^{-(16-2n)}$, $X^{+n}M_9O_{32}^{-(10-n)}$, and $X^{+n}M_6O_{24}H_6^{-(6-n)}$, wherein "M" typically is Mo or W, and "X" typically is as described for the Keggin compounds.

Figure 2:
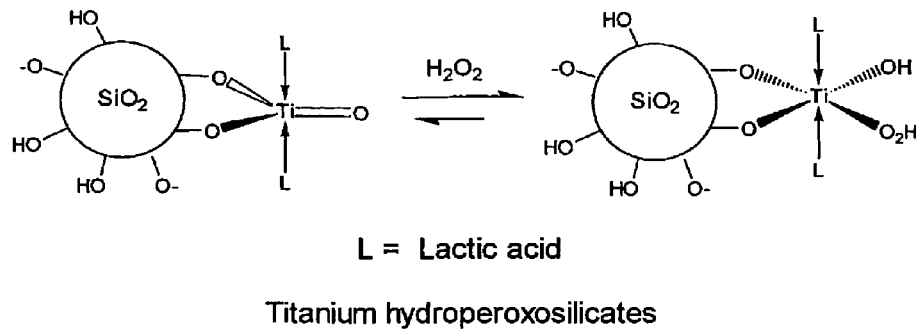
FIG. 2 illustrates a typical synthesis of a hydroperoxotitanium silicate complex.
Figure 3:
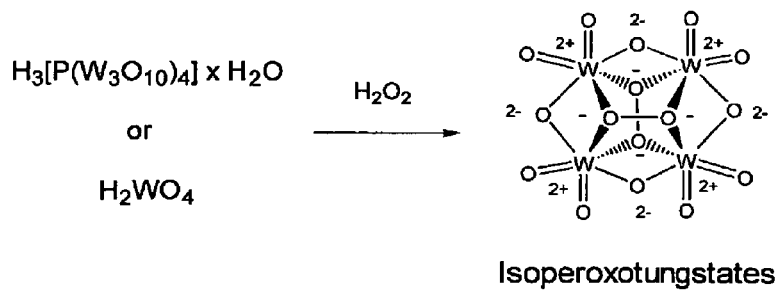
FIG. 3 illustrates typical syntheses of a peroxotungstate complex.

Peroxometalate complexes and precursors thereof are well known in the inorganic chemical arts (see e.g., Cotton and Wilkinson, *Advanced Inorganic Chemistry*, 5th Ed., John Wiley & Sons, New York, 1988). FIG. 1 illustrates typical syntheses of peroxotitanium complexes. FIG. 2 illustrates a typical synthesis of a hydroperoxotitanium silicate complex. FIG. 3 illustrates typical syntheses of a peroxotungstate complex, and the cage-like structure of the complex.

Non-limiting examples of preferred peroxometalate complexes include peroxotitanium complexes, isoperoxotungstates, titanium hydroperoxosilicates, and the like. Non-limiting examples of preferred oxidizable precursors of peroxometalate complexes include tungstic acid, phosphotungstic acid, titanium(IV) salts such as titanium (IV) bis (ammonium lactato) dihydroxide, ammonium citratoperoxotitanate (IV), Keggin anions of tungsten, phosphorus, and/or molybdenum, and the like. In the case of titanium peroxosilicates, a titanium salt can be oxidized by hydrogen peroxide in the presence of silica particles to form a peroxotitanate complexed with the surface of the silica particles.

The peroxometalate complex or precursor thereof can be present in the CMP compositions of the invention in any amount sufficient to catalytically oxidize ruthenium in the presence of hydrogen peroxide and provide suitably high Ru removal rates. The amount of soluble peroxometalate complex present in the CMP composition typically is in the range of about 0.05 to about 1 percent by weight. During the CMP process, the peroxometalate precursor oxidized by hydrogen peroxide to form the peroxometalate oxidant, in situ.

The CMP compositions of the invention also include a particulate abrasive. The abrasive can be any abrasive material suitable for use in CMP processes, such as silica, alumina, titania, zirconia, ceria, doped silica, and combinations thereof. Preferably, the abrasive comprises silica (e.g., colloidal silica or fumed silica). The particulate abrasive can be present in the CMP composition in any suitable concentration. Preferably, the CMP composition comprises about 0.5 to about 10 percent by weight of the particulate abrasive. The particulate abrasive preferably has a mean particle size in the range of about 5 to about 50 nm.

The abrasive desirably is suspended in the CMP composition, more specifically in the aqueous component of the CMP composition. When the abrasive is suspended in the CMP composition, the abrasive preferably is colloidally stable. The term colloid refers to the suspension of abrasive particles in the liquid carrier. Colloidal stability refers to the maintenance of that suspension over time. In the context of this invention, a particulate polyoxometalate complex abrasive is considered colloidally stable if, when the abrasive is placed into a 100 mL graduated cylinder and allowed to stand without agitation for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., $([B]-[T])/[C] \leqq 0.5$). The value of $([B]-[T])/[C]$ desirably is less than or equal to 0.3, and preferably is less than or equal to 0.1.

The CMP compositions of the invention can have any pH that is compatible with oxidation of the reduced form of the peroxometalate complex by hydrogen peroxide. When the peroxometalate is a peroxotitanate, preferably the pH of the composition during the CMP process is basic (e.g., in the range of about 8 to about 9). When the peroxometalate is a peroxotungstate, the pH of the composition during the CMP process can be acidic (e.g., in the range of about 2 to about 5) or basic (e.g., in the range of about 8 to about 10). The CMP compositions optionally can comprise one or more pH buffering or adjusting materials, for example, acids, bases, and salts such as ammonium acetate, disodium citrate, and the like. Many such pH adjusting and buffering materials are well known in the art.

The aqueous carrier can be any aqueous liquid suitable for use in CMP process. Such compositions include water, aqueous alcohol solutions, and the like. Preferably, the aqueous carrier comprises deionized water.

The CMP compositions of the invention optionally can comprise one or more additives, such as a surfactant, a rheological control agent (e.g., a viscosity enhancing agent or coagulant), a corrosion inhibitor (e.g., benzotriazole (BTA) or 1,2,4-triazole compounds such as 3-(4-tert-butylphenyl)-4-phenyl-5-(4-biphenylyl)-1,2,4-triazole (TAZ), a dispersant, a biocide, and the like.

The CMP compositions of the invention can be prepared by any suitable technique, many of which are known to those skilled in the art. For example, the CMP composition can be prepared in a batch or continuous process. Generally, the CMP composition can be prepared by combining the components thereof in any order. The term "component" as used herein includes individual ingredients (e.g., abrasive, peroxometalate, peroxometalate precursor, acids, bases, and the like) as well as any combination of ingredients. For example, the peroxometalate complex, a precursor thereof, or a combination of peroxometalate and precursor, can be dissolved in water, the abrasive can be dispersed in the resulting solution, and any additional additive materials such as rheological control agents, buffers, and the like can then be added and mixed by any method that is capable of uniformly incorporating the components into the CMP composition. The pH can be adjusted at any suitable time, if needed. Hydrogen peroxide can be added just prior to use and/or during the CMP process.

The CMP compositions of the present invention also can be provided as a concentrate, which is intended to be diluted with an appropriate amount of water prior to use. In such an embodiment, the CMP composition concentrate can comprise an abrasive and a peroxometalate complex, a peroxometalate precursor, or a combination thereof, and other components dispersed or dissolved in an aqueous carrier in amounts such that, upon dilution of the concentrate with an appropriate amount of aqueous solvent, each component of the polishing composition will be present in the CMP composition in an amount within the appropriate range for use.

The invention also provides a method of chemically-mechanically polishing a ruthenium-containing substrate comprising (i) contacting the substrate with a polishing pad and a CMP composition described herein, in the presence of sufficient hydrogen peroxide to maintain a ruthenium-oxidizing effective amount of the peroxometalate in the CMP composition for the duration of the CMP process, and (ii) moving the polishing pad relative to the substrate with at least a portion of the CMP composition therebetween, thereby abrading at least a portion of the ruthenium from the surface of the substrate to polish the substrate.

The CMP methods of the present invention can be used to polish any suitable substrate, and are especially useful for polishing semiconductor substrates comprising ruthenium. In addition, the CMP compositions of the invention can be advantageously utilized in combination with hydrogen peroxide to polish silicon dioxide substrates (e.g., PETEOS). Suitable substrates include, without limitation, wafers used in the semiconductor industry.

The CMP methods of the present invention are particularly suited for use in conjunction with a chemical-mechanical polishing apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the combined chemical and mechanical action of the polishing pad, the CMP composition of the invention, and the hydrogen peroxide, which act together to abrade at least a portion of the substrate to polish the surface.

A substrate can be planarized or polished with a CMP composition of the invention using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, conformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353 to Sandhu et al., U.S. Pat. No. 5,433,651 to Lustig et al., U.S. Pat. No. 5,949,927 to Tang, and U.S. Pat. No. 5,964,643 to Birang et al. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope.

EXAMPLE 1

This example illustrates the use of CMP compositions of the invention to polish ruthenium substrates.

Figure 4:
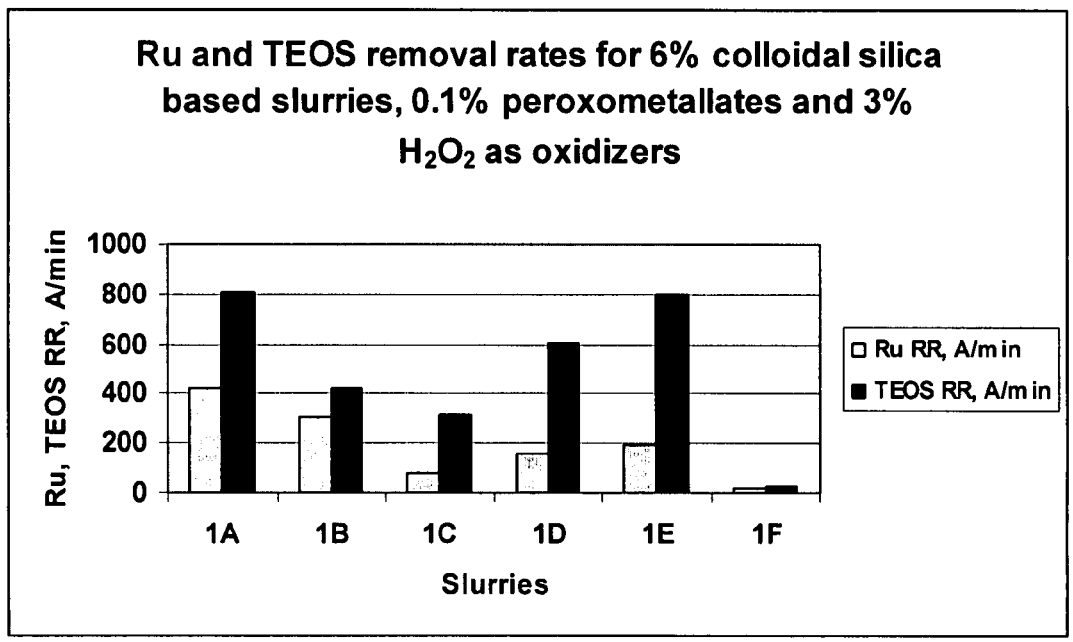
FIG. 4 provides a bar graph showing ruthenium removal rates and PETEOS removal rates, in Å/min, obtained by polishing blanket wafers (Ru or PETEOS, respectively) with CMP compositions of the invention (1A and 1B), compared to conventional CMP compositions (1C, 1D, 1E and 1F).

Two CMP compositions of the invention (1A and 1B) and four comparative compositions (1C, 1D, 1E, and 1F) were utilized to polish 4-inch diameter ruthenium blanket wafers in the presence of 3 percent hydrogen peroxide, on a Logitech polisher having a D-100 polishing pad (Cabot Microelectronics Corp., Aurora, Ill., USA), under the following polishing conditions: platen speed of about 90 rpm, carrier speed of about 93 rpm, down pressure of about 3.1 pounds-per-square inch (psi), and a slurry flow rate of about 180 milliliters-per-minute (mL/min). The formulation and pH of each composition are shown in Table 1. Composition 1A included about 0.1 percent by weight Ti(IV) bis(ammonium lactato) dihydroxide, a peroxotitanate precursor, while composition 1B included about 0.1 percent by weight phosphotungstic acid, a peroxotungstate precursor. FIG. 4 provides a bar graph showing the ruthenium removal rates, in Angstroms-per-minute (Å/min), observed with each composition.

TABLE 1

| Example | Formulation |
| --- | --- |
| 1A | 6% colloidal silica (48 nm mean particle size), 0.5% TAZ, 0.01% BTA, and 0.1% Ti(VI) bis(ammonium lactato) dihydroxide; pH 8.4 |
| 1B | 6% colloidal silica (48 nm), 0.5% TAZ, 0.01% BTA, and 0.1% phosphotungstic acid; pH 3. |
| 1C | 6% colloidal silica (48 nm), 0.5% TAZ, and 0.01% BTA; pH 3 (control) |
| 1D | 6% colloidal silica (48 nm), 0.5% TAZ, 0.01% BTA, and $ZrO_2$/polyAMPS; pH 8.4 |
| 1E | 6% colloidal silica (48 nm), 0.5% TAZ, 0.01% BTA, and $TiO_2$/polyAMPS; pH 8.4 |
| 1F | 6% colloidal silica (30 nm), 0.5% TAZ, and 0.01% BTA; pH 3 |

TAZ = 3-(4-tert-butylphenyl)-4-phenyl-5-(4-biphenylyl)-1,2,4-triazole;
BTA = benzotriazole
polyAMPS = poly(2-acrylamido-2-methyl-1-propanesulfonic acid)

As the data in FIG. 4 demonstrate, the CMP compositions of the invention (1A and 1B) provided unexpectedly superior ruthenium removal rates (RR), i.e., about 300 to about 400 Å/min, compared to the conventional CMP compositions, which provided less than 200 Å/min Ru removal rates.

EXAMPLE 2

This example illustrates the use of CMP compositions of the invention to polish silicon dioxide substrates.

The CMP compositions described in Example 1 were utilized to polish 4-inch diameter PETEOS blanket wafers in the presence of 3 percent hydrogen peroxide, on a Logitech polisher having a D-100 polishing pad, under the following polishing conditions: platen speed of about 90 rpm, carrier speed of about 93 rpm, down pressure of about 3.1 psi, and a slurry flow rate of about 180 mL/min. FIG. 4 also provides a bar graph showing the PETEOS removal rates, in Å/min, observed with each composition.

As the data in FIG. 4 demonstrate, the CMP compositions of the invention (1A and 1B) provided excellent PETEOS removal rates of greater than 400 Å/min.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise contradicted by context.

What is claimed is:

1. A chemical-mechanical polishing (CMP) method for polishing a ruthenium-containing substrate in the presence of hydrogen peroxide without forming a toxic level of ruthenium tetroxide, comprising the steps of:
   (a) contacting a surface of the ruthenium-containing substrate with a polishing pad and an aqueous CMP composition in the presence of hydrogen peroxide; and
   (b) causing relative motion between the polishing pad and the substrate while maintaining a portion of the CMP composition and hydrogen peroxide in contact with the surface between the pad and the substrate for a time period sufficient to abrade at least a portion of the ruthenium present in the substrate from the surface;

wherein the CMP composition comprises (i) a catalytic oxidant comprising a water-soluble peroxometalate complex and an oxidizable precursor of a peroxometalate complex, the peroxometalate complex and the precursor thereof each having a reduced form that is oxidizable by hydrogen peroxide to generate the peroxometalate complex during chemical-mechanical polishing, wherein the water soluble peroxometalate complex is selected from the group consisting of an isoperoxotungstate compound, a peroxotitanate compound and a titanium hydroperoxosilicate compound, and wherein the oxidizable precursor of the peroxometalate complex is selected from the group consisting of an acidic tungsten-containing compound and a titanate compound; (ii) a particulate abrasive; and (iii) an aqueous carrier.

2. The method of claim 1 wherein the particulate abrasive is present in the composition in an amount in the range of about 0.5 to about 10 percent by weight.

3. The method of claim 1 wherein the particulate abrasive has a mean particle size in the range of about 5 to about 50 nm.

4. The method of claim 1 wherein the catalytic oxidant is present in the composition in an amount in the range of about 0.05 to about 1 percent by weight.

5. The method of claim 1 wherein the peroxometalate complex comprises an isoperoxotungstate compound.

6. The method of claim 1 wherein the peroxometalate complex comprises a peroxotitanate compound.

7. The method of claim 1 wherein peroxometalate complex comprises a titanium hydroperoxosilicate compound.

8. The method of claim 1 wherein the oxidizable precursor of the peroxometalate complex comprises an acidic tungsten-containing compound.

9. The method of claim 8 wherein the acidic tungsten-containing compound is selected from the group consisting of tungstic acid, polytungstic acid, phosphotungstic acid, and a combination of two or more of the foregoing.

10. The method of claim 1 wherein the oxidizable precursor of the peroxometalate complex comprises a titanate compound.

11. The method of claim 10 wherein the titanate compound is selected from the group consisting of a titanium(IV) citrate complex, a titanium(IV) lactate complex, and a combination thereof.

\* \* \* \* \*